SURFACE-POTENTIAL CONTROLLED SEMICONDUCTOR DEVICE

Filed June 11, 1962 3 Sheets-Sheet 1

INVENTOR.
CHIH-TANG SAH

BY

Lippincott, Ralls & Hendricson
ATTORNEYS

INVENTOR.
CHIH-TANG SAH

BY

Lippincott, Ralls & Hendricson
ATTORNEYS

March 29, 1966 CHIH-TANG SAH 3,243,669

SURFACE-POTENTIAL CONTROLLED SEMICONDUCTOR DEVICE

Filed June 11, 1962 3 Sheets-Sheet 3

INVENTOR.
CHIH-TANG SAH

BY

Lippincott, Ralls & Hendricson
ATTORNEYS

United States Patent Office 3,243,669
Patented Mar. 29, 1966

3,243,669
SURFACE-POTENTIAL CONTROLLED SEMICONDUCTOR DEVICE
Chih-Tang Sah, Oakland, Calif., assignor to Fairchild Camera and Instrument Corporation, Syosset, N.Y., a corporation of Delaware
Filed June 11, 1962, Ser. No. 201,456
13 Claims. (Cl. 317—234)

This invention relates to improved surface-potential controlled semiconductor devices, specifically semiconductor tetrodes, PNPN devices, and the like, useful as electronic switches, A.-C. and D.-C. amplifiers, oscillators, mixers, etc. New devices are provided capable of cutting off collector current completely, thereby making them particularly useful as electronic switches, as in computers and automatic gain control circuits.

Surface-potential controlled semiconductor devices differ from the usual semiconductor devices in that they have a control electrode capacitatively coupled to the semiconductor in the vicinity of the emitter-base junction. The voltage applied to this control electrode influences currents flowing between other electrodes of the device, particularly the collector current. This is accomplished by an effect on the recombination of holes and electrons at the surface of the semiconductor by the application of an electric potential or charge to the control electrode. Because this control electrode is insulated from the semiconductor body and capacitatively coupled thereto, the input impedance to the control electrode is generally extremely high. This electrode is therefore similar to the grid of a vacuum tube. A further explanation may be found in copending application, Serial No. 102,515, now U.S. Patent No. 3,204,160 assigned to the same assignee as the present application.

Previously, surface-potential controlled semiconductor devices had one principal disadvantage: although the collector current $I_c$ of the device could be substantially increased or reduced relative to the base current $I_b$ by adjusting the potential of the control electrode, complete cutoff of collector current $I_c$ was not possible by this means. When these devices were used in high level switching circuits, a relatively large collector current $I_{cco}$ remained when the device was operated in the cutoff region. This cutoff current $I_{cco}$ wastes power, leads to heat dissipation problems, and introduces other problems in circuit design—in direct-coupled circuits and high level switching circuits, for instance. Hence, it would be extremely desirable, in operating the device in the cutoff position, to have the minimum possible $I_{cco}$ passing through the collector circuit, i.e., $I_{cco}$ equal to the collector leakage current $I_{co}$, which is usually less than $1\times10^{-9}$ ampere for planar devices.

By proper adjustment of the control voltage in the improved surface-potential controlled semiconductor devices of this invention, virtually complete cutoff of collector current, $I_{cco}$ is achieved so that $I_{cco}=I_{co}$. This is accomplished by an improved device design having an extra region of different conductivity type from the base region disposed within the base region, extending inwardly from the surface. This region may be ohmically connected to the base region, if desired, where complete cutoff of collector current is to be obtained. This region serves as a shorting end to the surface channel region which connects in parallel to the emitter-base junction. The devices of this invention are therefore eminently adapted for use in switching circuits, i.e., relays and the like, where virtually complet eelimination of $I_{cco}$ is essential. Of course, many other uses will become obvious to one skilled in transistor applications.

The semiconductor devices of this invention comprise a body of monocrystalline semiconductor with adjacent regions of different conductivity types. Essentially, the devices of the invention have a first region of one conductivity type. This may be either P- or N-type; the conductivity types of the remaining regions of the device are chosen according to the type used for this first region. Two separated regions of the opposite conductivity type from the first region are disposed within the first region and extend inwardly from its surface. These separated regions form two separated PN junctions with the first region. The junctions extend to the surface of the semiconductor and have edges there. Between the two junctions is a surface channel region which lies adjacent to and touching the first region. This region is generally a thin region and may be of either conductivity type. A control electrode is capacitatively coupled to the semiconductor in spaced relationship to the surface channel region and to the edges of the two PN junctions. There is generally an insulating layer in this space between the control electrode and the surface channel region. Where the semiconductor material is silicon, this is preferably silicon dioxide. The control electrode is adapted to change the conductivity type of the surface channel region in response to a change in its potential. Finally, there are means, usually electrodes, for passing current across the PN junctions. In a preferred embodiment of the invention, where virtually complete elimination of $I_{cco}$ is desired, there is an ohmic connection between one of the separated regions and the first region of the device. This ohmic connection may, if desired, be an electrode.

There are many variations possible in the devices of the invention. For example, they may have an emitter, base, and collector region, as well as one or more shorting regions. Or they may be PNPN devices. The various possibilities may be better understood from the following illustrative description and the accompanying drawings, in which.

Figure 1:
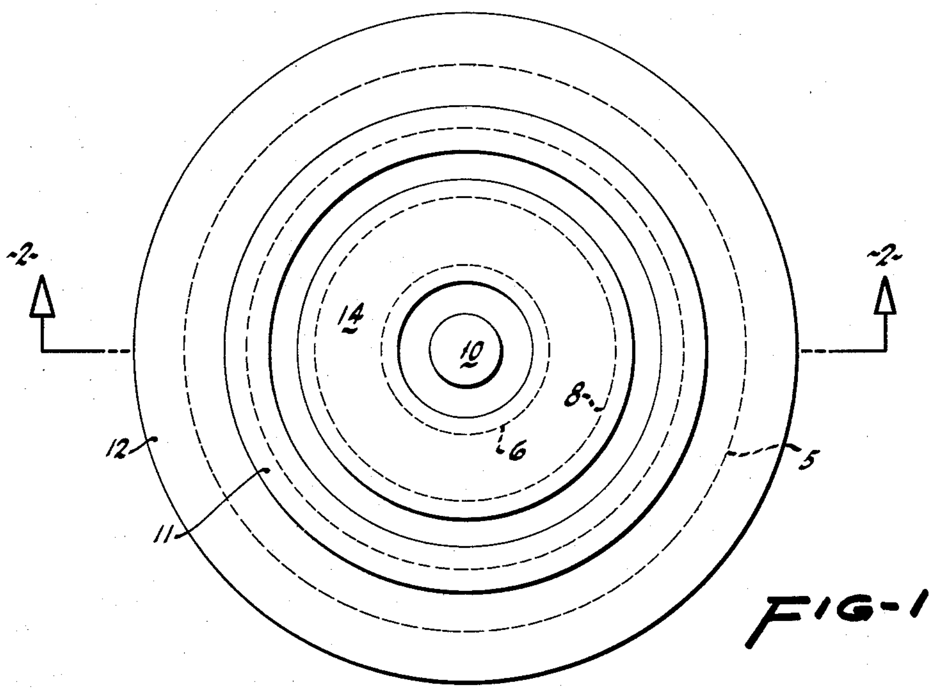
FIG. 1 is a somewhat schematic, greatly enlarged, plan view of a semiconductor device embodying the invention.
Figure 2:
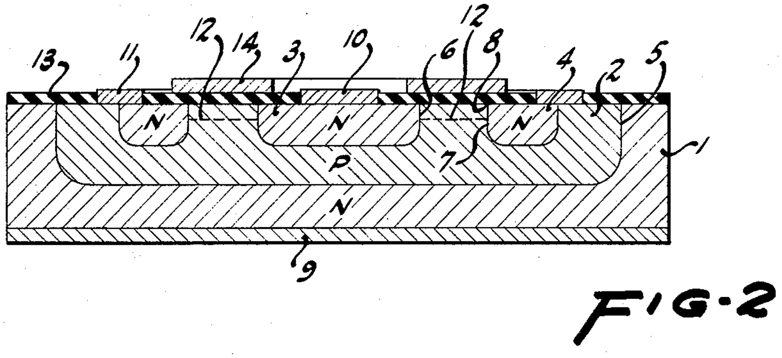
FIG. 2 is a somewhat schematic, transverse section taken along the line 2—2 of FIG. 1.

FIGS. 1 and 2 illustrate an NPN surface-potential controlled semiconductor device having emitter, base, and collector regions customary for such devices and having in addition a shorting region which in this embodiment is ohmically connected to the base region to achieve virtually complete cutoff of collector current, in accordance with the principles of the invention. A PNP transistor would be the same, but with the conductivity type of each region reversed. As illustrated, a monocrystalline body of semiconductor, e.g., silicon or any other semiconductor useful in the fabrication of transistors, contains a collector region 1 of N conductivity type, a base region 2 of P conductivity type, an emitter region 3 of N conductivity type, and a shorting region 4 also of N conductivity type. In the planar configuration illustrated, the base-collector junction between regions 1 and 2 extends to the top surface of the semiconductor and is bounded there by an edge 5 which extends completely around the periphery of base region 2. The emitter-base junction between regions 2 and 3 also extends to the top surface of the semiconductor and is bounded there by an edge 6 extending completely around the periphery of emitter region 3. There is also provided an additional junction 7 between the shorting region 4 and base 2. This junction, too, extends to the top surface of the semiconductor and is bounded there by an edge 8. Electrodes 9 and 10 are in ohmic contact with the collector and emitter regions, respectively. In the preferred embodiment shown in FIGS. 1 and 2, shorting region 4 and the base region 2 are ohmically connected by electrode 11. The surface channel region 12 is spaced apart from the control electrode by means of insulating layer 13. Conveniently, electrode 9 may be a metal layer deposited on the back or underside of the semiconductor; electrode 10 may be a metal film deposited on the top surface of the semiconductor over and in contact with the emitter region; and electrode 11 may be a metal film deposited on the top surface of the semiconductor, over and in contact with both a portion of the shorting region 4 and a portion of the base region 2, as shown.

The whole top surface of the semiconductor, except the portions covered by contacts 10 and 11, is covered and protected by an insulating layer 13, preferably, in the case of silicon, an oxide of the same material of which the semiconductor is made. This oxide may be formed by oxidizing the surface of the semiconductor at an early stage of fabrication, thereby firmly adhering it to the semiconductor surface. Oxidation layer 13 protects the junctions during and after manufacture, resulting in improved transistor quality and reliability. Region 1 may have the conductivity of the original crystal from which the transistor is fabricated, and regions 2, 3, and 4 may be formed by diffusing impurities through holes etched or engraved in the oxide layer 13, in accordance with processes already known in the art.

However, insofar as the essential principles of the present invention are concerned, regions 1, 2, 3, and 4 may be formed in any desired manner, and layer 13 may be of an insulating material. Also, the essential requirement for layer 13 is only that it separate and insulate the control electrode 14 from the semiconductor body, although it is preferable that it cover the whole surface of the device for protection. Hence, the invention is not limited to transistors of planar configuration as illustrated, but it may also be applied, for example, to mesa transistors. In the embodiment illustrated, control electrode 14 is an annular film of metal coated only onto the insulating layer 13 immediately over the surface channel region 12 and junction edges 6 and 8, as shown, so that control electrode 14 is in capacitatively coupled relation to the semiconductor adjacent to the surface channel region 12. A metal film electrode adheres firmly to the insulating oxide layer, forming a durable structure. A voltage applied between control electrode 14 and the base region affects the surface potential in the surface channel region 12. This has a significant effect upon current flowing between other electrodes of the transistor, as explained below.

Figure 3:
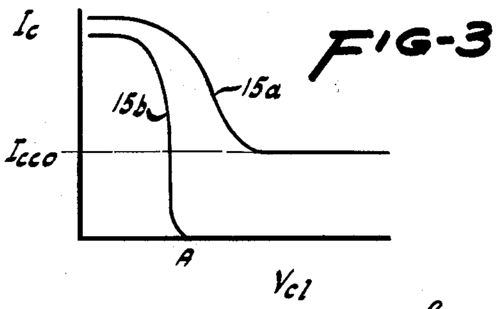
FIG. 3 is a graph showing the collector current plotted as a function of control voltage for different semiconductor devices.

At this point, it will be helpful to understand in detail how the improved devices of the invention operate in a circuit. The advantages of the invention will be readily obvious from the graph in FIG. 3. Important applications of surface-potential controlled semiconductor devices take advantage of their ability to control currents flowing between electrodes of the device by varying the voltage at the control electrode or electrodes. Curve 15*a*, FIG. 3, illustrates the effect of varying the control electrode voltage on the collector current using an NPN surface-potential controlled device without the improvements of this invention. An increase in control electrode voltage causes a decrease in the collector current. However, this decrease tends to level off with increased control voltage, to a level shown as $I_{cco}$. With surface-potential controlled semiconductor devices without the improvement of this invention, it was not possible to eliminate almost completely $I_{cco}$, the cutoff collector current.

The theoretical explanation of the failure of the prior art devices to cut off collector current completely is as follows: the emitter-base junction, although narrow, embraces a transition region which contains recombination centers located at the silicon-silicon oxide interface. Charged carriers are trapped at these centers and recombine with carriers of opposite polarity. Thus, electrons and holes recombine at the surface edge of the emitter-base junction at a rate of $U_s$ which may be expressed in terms of the surface recombination velocities $S_{po}$ and $S_{no}$. These velocities are similar to the bulk carrier lifetimes $\tau_{po}$ and $\tau_{no}$ in the Shockley-Read-Hall theory of electron-hole recombination via recombination centers. The so-recombining carriers constitute a current across the emitter-base junction.

In prior surface-potential controlled semiconductor devices, the surface recombination rate, $U_s$, was controlled by means of a voltage applied to the control electrode which is capacitatively coupled to the semiconductor surface near the emitter-base junction. The voltage applied to the control electrode varied the electric surface potential in the vicinity of the edge of the base-emitter junction. This shifted the Fermi level near the surface of the crystal in relation to the energy level of the surface recombination centers. The relative position of the Fermi level and the surface state energy level determined the recombination rate. In addition, if the applied control voltage were of a correct polarity (positive for an NPN device) and if it were large enough in magnitude, a surface channel was induced beneath the control electrode. This induced surface channel was the same conductivity type as the emitter and was therefore connected to the emitter region. Under this condition, the amount of recombination in the vicinity of the emitter-base junction was greatly increased and the collector current concomitantly decreased.

From the above explanation, it can be seen that control of the current distribution within surface-potential controlled semiconductor devices without the improvements of this invention was achieved primarily by the effect of the control electrode upon recombination of carriers in the surface channel region near the edge of the emitter-base junction. For example, in an NPN device, increasing the control electrode voltage positively increased the carrier recombination by moving the Fermi level relative to the energy level of the recombination centers to a more favorable position. This increased current flow from the emitter to the base electrode, thereby decreasing the current flow from the emitter to the collector. However, it was not possible with these devices to eliminate current flow from emitter to collector almost completely. No matter how large a positive control voltage was applied which substantially increased carrier recombination, and hence the base current $I_b$, some collector current $I_{cco}$ still flowed.

With the improved surface-potential controlled semiconductor devices of this invention, virtually complete cutoff of the collector current is possible by proper adjustment of the control electrode voltage. This occurs at voltage A in curve 15*b* of FIG. 3. The value of the cutoff voltage A for each device may be determined empirically. The theoretical explanation of this effect is shown by reference again to FIGS. 1 and 2. In a semiconductor, current $I_b$ flows from the emitter contact 10, through the N material of the emitter 3, through the P material of the base 2, to the base contact 11. Current $I_c$ also flows from the emitter contact 10, through the emitter 3, through the base 2, through the collector 1, to the collector contact 9. In the NPN semiconductor device illustrated, the control electrode voltage is generally made positive where $I_c$ is to be reduced or eliminated. Control electrode 14 is capacitatively coupled to the surface channel region 12 extending between junction edges 6 and 8, as shown. The positive voltage at the electrode 14 creates a positive charge on the electrode. The surface channel region 12 which is capacitatively coupled to control electrode 14 then becomes negatively charged. Although the surface channel is of P-type conductivity, i.e., electron-deficient or hole-containing, the negative charge at its surface not only fills the deficiency but also creates an excess of electrons and thus effectively changes the conductivity type of the surface channel to N-type. The surface channel is, in effect, a resistance connected across the emitter and base electrodes. It is possible, therefore, in the illustrated device having an ohmic connection between the shorting region and the base, to adjust the control voltage to a sufficient positive value to create a large enough low-resistance surface channel to be essentially a short circuit between the emitter electrode 10 and the base electrode 11. For a very large channel, essentially all the current flows from the emitter electrode 10 through the short circuit to the base electrode 11, completely cutting off any current $I_c$ which would otherwise flow to the collector electrode.

Figure 4:
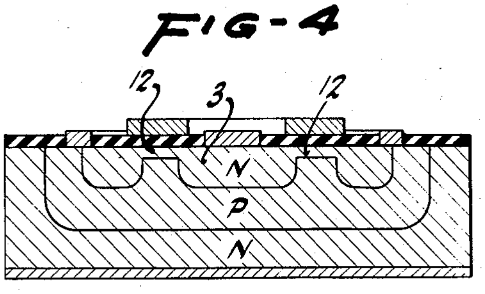
FIG. 4 is a greatly enlarged, somewhat schematic, transverse section illustrating another embodiment of the invention.

Another embodiment of the invention is shown in FIG. 4. There the surface channel region 12 is fabricated of the same conductivity type as the emitter region 3. The surface channel region is in parallel with the emitter-base junction when there is no control electrode voltage. In this embodiment, a positive voltage at the control electrode places more electrons in the surface channel, creating the effective short circuit between the emitter and base electrodes. However, a negative voltage at the control electrode effectively makes the surface channel region 12 P-type, thus eliminating the shorting effect of the previously N-type surface channel. Whether the surface channel is the same conductivity type as the base or of the opposite conductivity type, its effect is the same. Only the magnitude and polarity of the control electrode voltage required to create a short circuit between emitter and base in the surface channel is changed.

Figure 5:
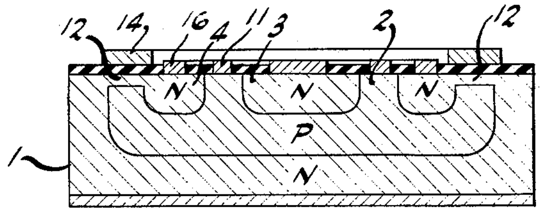
FIG. 5 is a greatly enlarged, somewhat schematic, transverse section illustrating an embodiment of the invention wherein the surface channel region is between the collector-base junction and a junction between the shorting region and the base.

FIG. 5 shows another embodiment of the invention, differing from the embodiment shown in FIG. 4 in two aspects. First, the surface channel region 12 is between the shorting region 4 and collector region 1, rather than between shorting region 4 and emitter region 3. Surface channel region 12 is of the same conductivity type as shorting region 4 and collector region 1. The control electrode 14 over surface channel region 12 serves effectively to change the conductivity type of the surface channel. When no voltage is applied to control electrode 14, a direct path of current flow from collector region 1 into shorting region 4 is available through surface channel region 12. However, when a sufficient negative voltage is applied at control electrode 14, the surface channel region 12 is effectively changed to P-type conductivity. For this reason, the previously available current path between collector 1 and shorting region 4 through surface channel region 12 is eliminated. Control electrode 14, therefore, located over a surface channel between collector and shorting regions provides another way of controlling currents in the semiconductor device.

The second difference between the device of FIG. 5 and the device of FIG. 4 is that base electrode 11 is not connected to shorting region electrode 16. If desired, in a circuit application, these electrodes may be ohmically connected. However, where the circuit application of these devices of this invention does not require complete cut-off of collector current, it is not always necessary to have an ohmic connection between the shorting region 4 and the base region 2.

Figure 6:
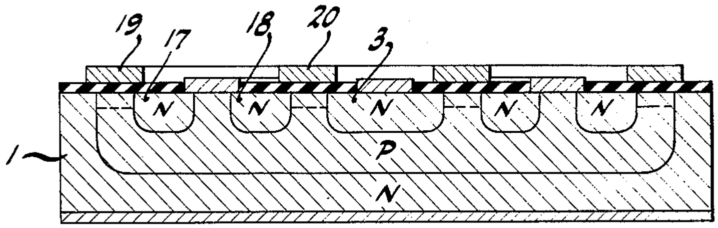
FIG. 6 is a somewhat schematic, greaty enlarged, transverse section showing an embodiment of the invention having two control electrodes.

Another embodiment of the invention is shown in FIG. 6. This embodiment has two surface channel regions shown by dotted lines: the first is between a first shorting region 17 and a collector region 1; the second is between a second shorting region 18 and emitter region 3. The currents through this surface-potential controlled semiconductor device are controlled both by control electrode 19 and control electrode 20.

Figure 7:
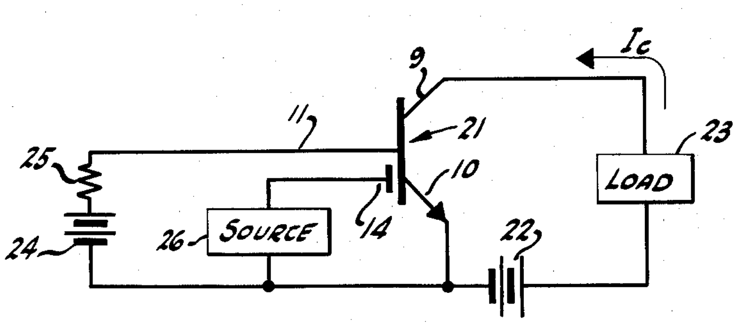
FIG. 7 is a circuit diagram of one possible circuit using the semiconductor device illustrated in FIGS. 1 and 2, the semiconductor device itself being represented by a recommended symbol.

A typical circuit using the semiconductor devices of this invention is illustrated in FIG. 7. Referring to that illustration, the transistor 21 illustrated in FIGS. 1 and 2 is represented by its recommended symbol. Base electrode 11, collector electrode 9, and emitter electrode 10 are conveniently represented as in the standard transistor symbol. The arrowhead pointing away on the emitter electrode signifies that the transistor is of the NPN type. The control electrode 14 is shown in a manner suggestive of its capacitatively coupled relation to the edge of the emitter-base junction. In the particular circuit illustrated in FIG. 7, the transistor 21 is connected in a grounded-emitter circuit. The emitter-collector operating voltage is provided by the battery or other voltage supply 22 connected in series with a load 23 between the emitter and collector electrodes. A constant bias current is supplied to the base, e.g., by means of the battery 24 and resistor 25 connected in series between the emitter and base electrodes, as shown. The input signal (voltage) source 26 is connected between the control electrode 14 and the emitter electrode 10.

Figure 8:
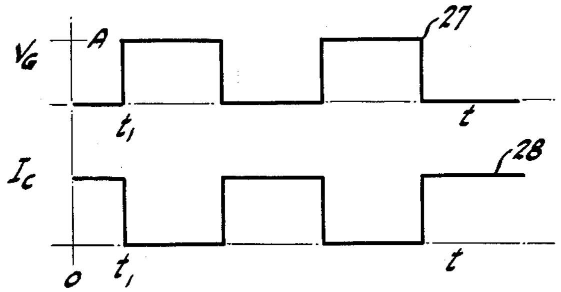
FIG. 8 is a graph showing the collector current and the control voltage plotted as a function of time for the circuit of FIG. 7 using a square-wave voltage source.

Operation of the circuit shown in FIG. 7 can best be understood by referring to FIG. 8, which is a graph depicting the source voltage $V_{c1}$ and load current $I_c$ as a function of time. For simplicity, such voltage $V_{c1}$ is shown as a square wave having an amplitude A equal to at least the calculated minimum cutoff voltage of the transistor 21 shown in FIG. 7. The circuit of FIG. 7 is acting as a relay or electronic switching circuit. Curve 27 shows a square wave voltage source $V_{c1}$ alternating between voltage A and zero voltage. When $V_{c1}$ is zero, there is no potential created at the surface of the device in the portion of the base region capacitatively coupled to the control electrode, and hence no short circuit is effected between the emitter contact 10 and the base contact 11 for a device having the surface channel of the same conductivity type as the base. Since appreciable resistance remains between emitter and base, normal collector current $I_c$ flows through the transistor to the load 23. However, at point $t_1$, the control voltage $V_{c1}$ increases to A, at least the calculated minimum cutoff voltage for the device. At that time, an effective short circuit is created between the emitter contact 10 and the base contact 11. Current then flows directly from emitter to base, completely cutting off the flow of current $I_c$ through the collector contact 9 into load 23. Hence, load current $I_c$ is reduced at $t_1$ to zero, as shown in curve 28 of FIG. 8.

Many other circuit configurations will become apparent to one skilled in the art. For example, referring to FIG. 7, the bias voltage 24 and resistor 25 could be interchanged with source 26, still retaining the grounded-emitter circuit configuration. The operation of such a transistor circuit is substantially identical to the operation of a conventional transistor connected as a grounded-emitter amplifier, or the like. The semiconductor devices of this invention may, of course, also be used in other known transistor circuit configurations, such as grounded-base circuits, grounded-collector circuits, and so forth. Since the surface-potential controlled transistors have circuit properties similar to a multigrid vacuum tube, they are extremely useful for circuits in variable-gain amplifiers, mixers, AGC circuits, voltage regulator circuits, modulators, mixers, and so on.

The invention is not limited to NPN and PNP transistors. It is readily applicable to other surface-potential controlled semiconductor devices containing adjacent regions of different conductivity types with junctions therebetween. For example, it is applicable to PNPN devices used for electronic switching and the like. PNPN devices embodying this invention are highly desirable because of their ability to cut off completely current to certain electrodes of the device.

Figure 9:
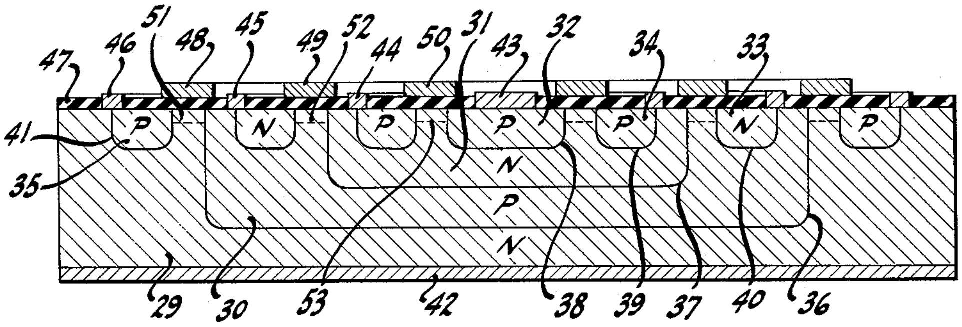
FIG. 9 is a somewhat schematic, greatly enlarged transverse section of a PNPN device embodying the invention.

Referring to FIG. 9, the PNPN device illustrated comprises a region of N conductivity type 29, a region of P conductivity type 30, a second region of N conductivity type 31, a second region of P conductivity type 32, and, peculiar to devices of this invention, a third region of N conductivity type 33, and a third region of P conductivity type 34 and a fourth region of P-type conductivity 35, disposed atop regions 30, 31, and 29, respectively. Junctions between these regions have circular edges 36, 37, 38, 39, 40, and 41, respectively, which extend to the top surface of the monocrystalline body of semiconductor, e.g., silicon. Electrode 42 on the bottom surface of the semiconductor and electrode 43 on the top surface of the semiconductor are in ohmic contact with region 29 and 32, respectively. Electrode 44 is in contact with both region 34 and region 31. Electrode 45 is in contact with both region 33 and region 30. Electrode 46 is in contact with both region 29 and region 35. All of the top surface of the semiconductor, except that occupied by the electrodes, is preferably covered by an insulating layer 47 which covers the edges of junctions 36, 37, 38, 39, 40, and 41. Preferably the layer 47 is an oxidized layer of the semiconductor, for example, silicon oxide, formed on the top surface of the semiconductor during manufacture of the device.

One or more control electrodes 48, 49, and 50 are provided on the top of the insulating layer 47, adjacent to surface channel regions 51, 52, and 53, respectively. These electrodes are in capacitatively coupled relationship to semiconductor surface in the immediate vicinity of the surface channel regions. Thus, the device illustrated may have as many as eight electrodes, five of which may make ohmic contact with one or two regions of the semiconductor surface, and three of which may be in capacitatively coupled relation to surface channel regions. For some applications, not all of these electrodes are needed; the device may have a minimum of three electrodes, two in ohmic contact with different regions of the semiconductor, e.g., electrodes 42 and 43, and one in capacitatively coupled relation to a surface channel region.

PNPN devices are commonly used for electronic switches. Devices having the improvements of this invention will, at cutoff, conduct no current between electrodes 42 and 43, thus having all the advantages of PNPN switches. In using the PNPN devices of this invention in circuit applications, both of the two end (top and bottom) regions 29 and 32 act as emitter regions, while the two intermediate regions 30 and 31 act as base regions. Thus, the top and bottom junctions may be both emitter-base junctions, and the middle junction may act in a manner similar to that of a collector junction.

The PNPN device can be switched either to the collector current cutoff state where essentially no current flows between electrodes 42 and 43 or to the state where a low resistance is presented to current flowing between electrodes 42 and 43 and hence current flows between them. Switching is accomplished by switching signals to electrodes 48, 49, and 50. During cutoff operation, junction 37 is reverse-biased. An instantaneous signal of relatively high voltage to electrode 49 instantaneously shorts the reverse-bias junction 37. This causes current to flow through the junction and therefore between electrodes 42 and 43. Equilibrium condition with continuous current flow between electrodes 42 and 43 is quickly reached. An instantaneous signal of a negative voltage to electrode 50 or a positive voltage to electrode 48 serves to cut off the device. This signal shorts junctions 38 or 36, drawing all the current from electrode 43 to electrode 44 or 45. In this way, junction 37 is instantaneously reverse-biased, stopping current flow between electrodes 42 and 43. Current flow rapidly reaches equilibrium with the junction 37 remaining reverse-biased. The device is then at cutoff, with essentially no current flow between electrodes 42 and 43.

It will be appreciated that the specific embodiments illustrated and described are but a few examples of a large number of devices made possible by the inventive principles herein disclosed, all of which are within the scope of the invention as set forth in the following claims.

What is claimed is:

1. A semiconductor device comprising a body of semiconductor having:

a first region of one conductivity type, a second region of the opposite conductivity type disposed within and adjacent to said first region and forming a first PN junction therewith, said junction having an edge at the surface of said body of semiconductor, two separated regions of said one conductivity type disposed within said second region and extending inwardly said from surface, said separated regions forming two separated PN junctions with said second region, each having an edge at said surface of the body of semiconductor, a surface channel region formed in said second region and extending the entire length between one of said two separated junctions and another adjacent junction, a control electrode capacitatively coupled to the semiconductor in spaced relationship to said surface channel region and overlapping the edges of the two junctions between which said surface channel region extends, means for passing electric current across said first PN junction and one of said separated PN junctions, an ohmic connection across the other of said separated PN junctions, and means for applying a potential to said control electrode so as to change the effective conductivity type of said surface channel region.

2. Semiconductor device of claim 1 wherein said control electrode is spaced apart from said surface channel region by an insulating layer.

3. Semiconductor device of claim 2 wherein said semiconductor is silicon and said insulating layer is silicon dioxide.

4. A semiconductor device comprising a body of semiconductor having:

a base region of one conductivity type, a collector region of the opposite conductivity type from said base region adjacent to said base region and forming a first PN junction therewith, said junction having an edge at the surface of said body of semiconductor, an emitter region and a shorting region, both of said opposite conductivity type disposed within said base region and extending inwardly from said surface, said regions forming two separated PN junctions with said base region, each having an edge at said surface of the body of semiconductor, a surface channel region formed in said base region and extending the entire length between the junction between the shorting region and the base region and one of the other of said junctions, a control electrode capacitatively coupled to the semiconductor in spaced relationship to said surface channel region and overlapping the edges of the junctions between which said surface channel region extends, means for passing electric current across said first PN junction and one of said separated PN junctions, and means for applying a potential to said control electrode so as to change the effective conductivity type of said surface channel region.

5. Device of claim 4 having an ohmic connection between said base region and said shorting region.

6. Semiconductor device of claim 4 wherein said surface channel region extends between said shorting region and said emitter region.

7. Semiconductor device of claim 4 wherein said surface channel region extends between said base region and said collector region.

8. A semiconductor device comprising a body of semiconductor having:

a base region of one conductivity type, a collector region of the opposite conductivity type adjacent to said base region and forming a first PN junction therewith, said junction having an edge at the surface of said body of semiconductor, an emitter region and two shorting regions of said opposite conductivity type disposed within said base region and extending inwardly from said surface, said regions each forming separated PN junctions with said base region, each of said junctions having an edge at said surface of said body of semiconductor, two surface channel regions formed in said base region, one extending the entire length between the base-emitter junction and the junction between one of said shorting regions and said base region, and the other extending between the base-collector junction and the junction between the other of said shorting regions and said base region, two control electrodes each capacitatively coupled to the semiconductor in spaced relationship to one of the two said surface channel regions, respectively, and overlapping the junction edges between which said surface channel region extends, means for passing electric current across said first PN junction between said emitter and said base region, and means for applying a potential to each of said control electrodes so as to change the effective conductivity type of said one of the two surface channel regions.

9. Device of claim 8 having an ohmic connection between said base region and at least one of said shorting regions.

10. A PNPN device comprising a body of semiconductor having:

two regions of one conductivity type arranged alternately with two regions of the opposite conductivity type, forming three PN junctions therebetween, one of said junctions between an outermost region and a second outermost region of said body of semiconductor having an edge at the surface of said body of semiconductor;

a fifth region of the opposite conductivity type from said second outermost region, disposed within said second outermost region and extending inwardly from said surface, forming a fourth PN junction with said second outermost region, said fourth junction having an edge at said surface of said body of semiconductor;

a surface channel region formed in said second outermost region and extending the entire length between the two PN junctions having edges at said surface of said body;

a control electrode capacitatively coupled to the semiconductor in spaced relationship to said surface channel region and said edges, means for passing electric current across said three PN junctions, and means for applying a potential to said control electrode so as to change the effective conductivity type of said surface channel region.

11. Device of claim 10 with an ohmic connection between said second outermost region and said fifth region.

12. A PNPN device comprising a body of semiconductor having:

a first region of one conductivity type;

a second region adjacent to said first region of the opposite conductivity type, forming a first PN junction therebetween having an edge at said surface of said body of semiconductor;

a third region of said one conductivity type adjacent to said second region forming a second PN junction therebetween having an edge at said surface of said body of semiconductor;

a fourth region of said opposite conductivity type adjacent to said third region and forming a third PN junction therebetween having an edge at said surface of said body of semiconductor;

a fifth region of said opposite conductivity type disposed within said third region and extending inwardly from said surface, forming a fourth PN junction with said third region having an edge at said surface of said body of semiconductor;

a sixth region of said one conductivity type disclosed within said second region and extending inwardly from said surface, forming a fifth PN junction with said second region having an edge at the surface of said body of semiconductor;

a seventh region of said opposite conductivity type disposed within said first region and extending inwardly from said surface, forming a sixth PN junction with said first region having an edge at said surface of said body of semiconductor;

a first surface channel region formed in said third region and extending the entire length between said third PN junction and said fourth PN junction;

a second surface channel region formed in said second region and extending the entire length between said second PN junction and said fifth PN junction;

a third surface channel region formed in said first region and extending the entire length between said first PN junction and said sixth PN junction;

control electrodes capacitatively coupled to the semiconductor in spaced relationship to each of said surface channel regions and overlapping the edges of the junctions between which said surface channel region extends, means for passing electric current across said first, second, and third PN junctions, and means for applying a potential to said control electrodes so as to change the effective conductivity type of said surface channel region.

13. A PNPN device of claim 12 having ohmic connections between:

(a) said first and said seventh regions;
(b) said second and said sixth regions; and
(c) said third and said fifth regions.

References Cited by the Examiner

UNITED STATES PATENTS

| | | | |
|---|---|---|---|
| 2,623,102 | 12/1952 | Shockley | 317—235 |
| 2,900,531 | 8/1959 | Wallmark | 317—235 |
| 2,981,877 | 4/1961 | Noyce | 317—234 |
| 2,985,804 | 5/1961 | Buie | 317—235 |
| 3,056,888 | 10/1962 | Atalla | 317—235 |
| 3,090,873 | 5/1963 | Mackintosh | 317—235 |
| 3,097,308 | 7/1963 | Wallmark | 317—235 |
| 3,102,230 | 8/1963 | Kahng | 317—235 |
| 3,124,703 | 3/1964 | Sylvan | 317—235 |

JOHN W. HUCKERT, *Primary Examiner.*

JAMES D. KALLAM, *Examiner.*

A. S. KATZ, J. D. CRAIG, *Assistant Examiners.*